United States Patent
Cravens et al.

(10) Patent No.: US 9,706,677 B2
(45) Date of Patent: *Jul. 11, 2017

(54) SUPPLEMENTAL STORAGE TRAY FOR INCREASING STORAGE CAPACITY WITHIN AN INFORMATION HANDLING SYSTEM

(71) Applicant: Dell Products L.P., Round Rock, TX (US)

(72) Inventors: Zachary A. Cravens, Round Rock, TX (US); Karl Isaac Hamand, Round Rock, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/941,440

(22) Filed: Nov. 13, 2015

(65) Prior Publication Data
US 2016/0073545 A1    Mar. 10, 2016

Related U.S. Application Data

(63) Continuation of application No. 13/962,004, filed on Aug. 8, 2013, now Pat. No. 9,229,496.

(51) Int. Cl.
| | |
|---|---|
| *H05K 7/14* | (2006.01) |
| *H05K 7/20* | (2006.01) |
| *G06F 1/18* | (2006.01) |
| *G06F 1/20* | (2006.01) |

(52) U.S. Cl.
CPC ........... *H05K 7/1489* (2013.01); *G06F 1/181* (2013.01); *G06F 1/187* (2013.01); *G06F 1/20* (2013.01); *H05K 7/1487* (2013.01); *H05K 7/20736* (2013.01); *Y10T 29/49002* (2015.01)

(58) Field of Classification Search
CPC ................................................ Y10T 29/49002
See application file for complete search history.

(56) References Cited

U.S. PATENT DOCUMENTS

| | | |
|---|---|---|
| 5,124,885 A | 6/1992 | Liu |
| 5,338,214 A | 8/1994 | Steffes et al. |
| 5,754,396 A | 5/1998 | Felcman et al. |
| 5,768,099 A | 6/1998 | Radloff et al. |
| 6,400,578 B1 | 6/2002 | Chen |
| 6,411,511 B1 | 6/2002 | Chen |
| 6,430,041 B1 * | 8/2002 | Johnson .................. G06F 1/181 165/126 |

(Continued)

*Primary Examiner* — Xanthia C Cunningham
(74) *Attorney, Agent, or Firm* — Isidore PLLC

(57) ABSTRACT

An information handling system includes a chassis having walls defining an interior cavity within the chassis and a bottom wall defining a backplane on which one or more processors are physically connected. At least one first storage device is connected to the chassis and communicatively coupled to the processor from another location within the chassis. A supplemental storage tray is provided having perimeter plates defining a bay within the supplemental storage tray for receiving a supplemental storage device that is communicatively coupled to the processor and provides additional storage capacity to the information handling system. The supplemental storage tray is physically located above the processor and in a different location from the first storage device.

20 Claims, 9 Drawing Sheets

(56) References Cited

U.S. PATENT DOCUMENTS

| | | | |
|---|---|---|---|
| 6,580,603 B1 | 6/2003 | Resnick | |
| 6,606,256 B1 | 8/2003 | Lee et al. | |
| 7,257,827 B2 * | 8/2007 | Lee | G11B 33/022 312/223.2 |
| 7,701,702 B2 * | 4/2010 | Chen | G06F 1/187 361/679.33 |
| 8,550,414 B2 * | 10/2013 | Chen | G11B 33/124 248/27.1 |
| 2001/0046117 A1 | 11/2001 | Felcman et al. | |
| 2002/0172003 A1 | 11/2002 | Bang et al. | |
| 2003/0112598 A1 | 6/2003 | Yokosawa | |
| 2003/0117779 A1 | 6/2003 | Gough et al. | |
| 2006/0018087 A1 * | 1/2006 | Mizuno | G06F 1/1656 361/679.02 |
| 2009/0016014 A1 * | 1/2009 | Tu | G11B 33/121 361/679.33 |
| 2011/0013356 A1 * | 1/2011 | Wang | G06F 1/187 361/679.33 |

* cited by examiner

SUPPLEMENTAL STORAGE TRAY FOR INCREASING STORAGE CAPACITY WITHIN AN INFORMATION HANDLING SYSTEM

RELATED APPLICATION

The present application is a continuation of and claims priority to U.S. patent application Ser. No. 13/962,004, titled "Supplemental Storage Tray for Increasing Storage Capacity within an Information Handling System" filed on Aug. 8, 2013.

BACKGROUND

1. Technical Field

The present disclosure generally relates to information handling systems and in particular to a supplemental storage tray for increasing the storage capacity within an information handling system.

2. Description of the Related Art

As the value and use of information continue to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

An information handling system can be configured in several different configurations. The information handling system can include multiple computers or servers with one or more processors. Each server can be physically mounted in an enclosure. The information handling system can further include storage systems that use storage devices such as hard disk drives. In one configuration, multiple hard disk drives are mounted in the enclosure and are connected to power and data connections in the information handling system. The enclosure can also include cooling devices such as fans that are mounted to cool the components of the server.

In one configuration, a shroud is mounted in the enclosure to direct the flow of cooling air from the cooling devices to the electronic components, such as the processor, memory and various other electronic components, in the server that require cooling. The shroud occupies valuable space within the server chassis and is a non-essential part of the server.

BRIEF SUMMARY

Disclosed is an information handling system (IHS), a supplemental storage tray, and a method that enables a supplemental storage device to be mounted in a server chassis. The supplemental storage device provides additional storage capacity to the information handling system.

According to one embodiment, an information handling system includes a chassis having walls that define an interior cavity within the chassis. A backplane is mounted to a bottom wall of the chassis and one or more processors are connected to the backplane. A first storage device is connected to the chassis and is communicatively coupled to the processor(s). A supplemental storage tray has perimeter plates that define a bay within the supplemental storage tray. The supplemental storage tray is suspended above the processor(s) by at least one wall of the chassis. A supplemental storage device is disposed in the bay and is communicatively coupled to the processor(s). The supplemental storage device provides additional storage capacity to the information handling system.

Also disclosed is a supplemental storage tray for use with an information handling system. The information handling system has a first storage device connected to a chassis. The first storage device is communicatively coupled to a processor. The supplemental storage tray includes perimeter plates that define a bay within the supplemental storage tray. The supplemental storage tray is connected to a chassis of the information handling system. A supplemental storage device is disposed in the bay and is communicatively coupled to the processor. The supplemental storage device provides additional storage capacity to the information handling system.

Also disclosed is a method for increasing storage within an electronic enclosure having a first storage device. The method includes mounting a supplemental storage tray into an area within a cavity above a processor within an information handling system chassis. The supplemental storage tray is suspended above the processor and other functional components affixed to the backplane. The supplemental storage tray has perimeter plates that define a bay. At least one supplemental storage device is secured in the bay and is communicatively coupled with the processor to provide additional storage capacity within the electronic enclosure beyond a storage capacity of the first storage device.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

The illustrative embodiments provide an information handling system (IHS), a supplemental storage and a method that enables a supplemental storage device to be mounted in a chassis. The supplemental storage device provides additional storage capacity to the information handling system.

In the following detailed description of exemplary embodiments of the disclosure, exemplary embodiments in which the various aspects of the disclosure may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present disclosure. The following detailed description is, therefore, not to be taken in a limiting sense.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

Figure 1:
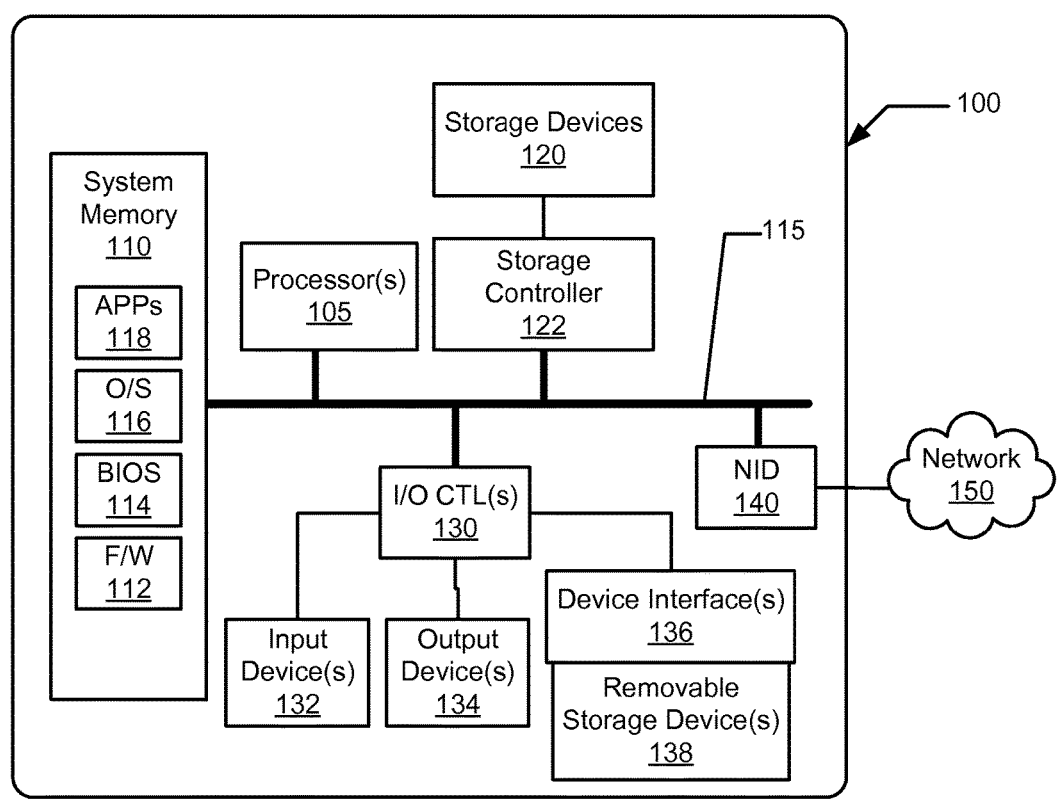
FIG. 1 illustrates an example information handling system within which various aspects of the disclosure can be implemented, according to one or more embodiments.

FIG. 1 illustrates a block diagram representation of an example information handling system (IHS) 100, within which one or more of the described features of the various embodiments of the disclosure can be implemented. For purposes of this disclosure, an information handling system, such as IHS 100, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring specifically to FIG. 1, example IHS 100 includes one or more processor(s) 105 coupled to system memory 110 via system interconnect 115. System interconnect 115 can be interchangeably referred to as a system bus, in one or more embodiments. Also coupled to system interconnect 115 is a storage controller 122 coupled to local storage 120 within which can be stored one or more software and/or firmware modules and/or data (not specifically shown). Storage controller 122 contains the logic necessary to read and write to local storage 120. In one embodiment, local storage 120 can be one or more hard drive storage devices. The one or more software and/or firmware modules within local storage 120 can be loaded into system memory 110 during operation of IHS 100. As shown, system memory 110 can include therein a plurality of modules, including firmware (F/W) 112, basic input/output system (BIOS) 114, operating system (O/S) 116, and application(s) 118. The various software and/or firmware modules have varying functionality when their corresponding program code is executed by processor(s) 105 or other processing devices within IHS 100.

IHS 100 further includes one or more input/output (I/O) controllers 130 which support connection by, and processing of signals from, one or more connected input device(s) 132, such as a keyboard, mouse, touch screen, or microphone. I/O controllers 130 also support connection to and forwarding of output signals to one or more connected output devices 134, such as a monitor or display device or audio speaker(s). Additionally, in one or more embodiments, one or more device interfaces 136, such as an optical reader, a universal serial bus (USB), a card reader, Personal Computer Memory Card International Association (PCMCIA) slot, and/or a high-definition multimedia interface (HDMI), can be associated with IHS 100. Device interface(s) 136 can be utilized to enable data to be read from or stored to corresponding removal storage device(s) 138, such as a compact disk (CD), digital video disk (DVD), flash drive, or flash memory card. In one or more embodiments, device interface(s) 136 can also provide an integration point for connecting other device(s) to IHS 100. In such implementation, device interfaces 136 can further include General Purpose I/O interfaces such as I$^2$C, SMBus, and peripheral component interconnect (PCI) buses.

IHS 100 comprises a network interface device (NID) 140. NID 140 enables IHS 100 to communicate and/or interface with other devices, services, and components that are located external to IHS 100. These devices, services, and components can interface with IHS 100 via an external network, such as example network 150, using one or more communication protocols.

Network 150 can be a local area network, wide area network, personal area network, and the like, and the connection to and/or between network and IHS 100 can be wired or wireless or a combination thereof. For purposes of discussion, network 150 is indicated as a single collective component for simplicity. However, it is appreciated that network 150 can comprise one or more direct connections to other devices as well as a more complex set of interconnections as can exist within a wide area network, such as the Internet.

Those of ordinary skill in the art will appreciate that the hardware components and basic configuration depicted in the various figures (e.g. FIG. 1) and described herein may vary. For example, the illustrative components within IHS 100 (FIG. 1) are not intended to be exhaustive, but rather are representative to highlight components that can be utilized to implement aspects of the present disclosure. For example, other devices/components may be used in addition to or in place of the hardware depicted. The depicted examples do not convey or imply any architectural or other limitations with respect to the presently described embodiments and/or the general disclosure.

Figure 2:
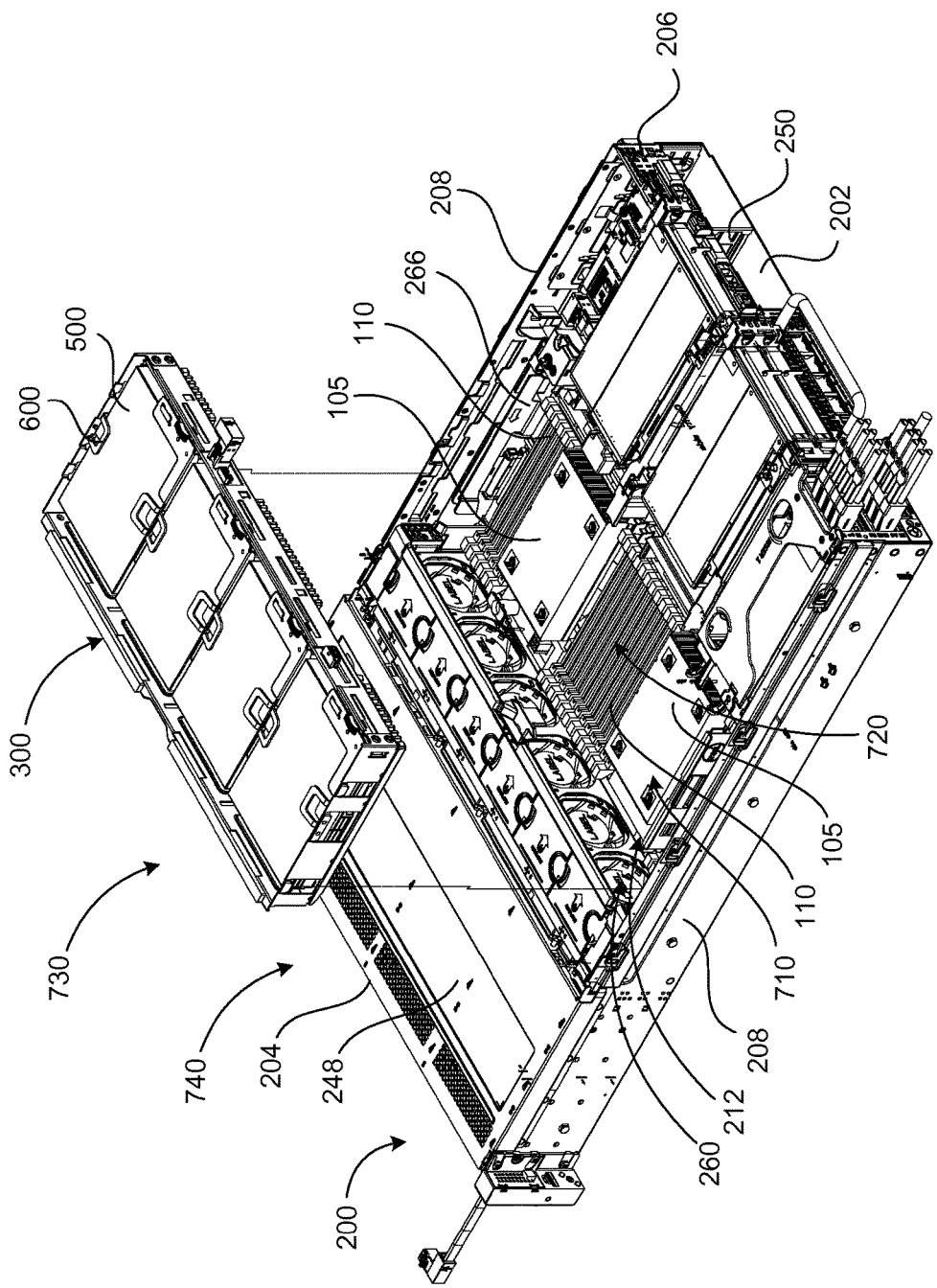
FIG. 2 illustrates a perspective view of an example server chassis with the supplemental storage tray removed, in accordance with one or more embodiments.
Figure 3:
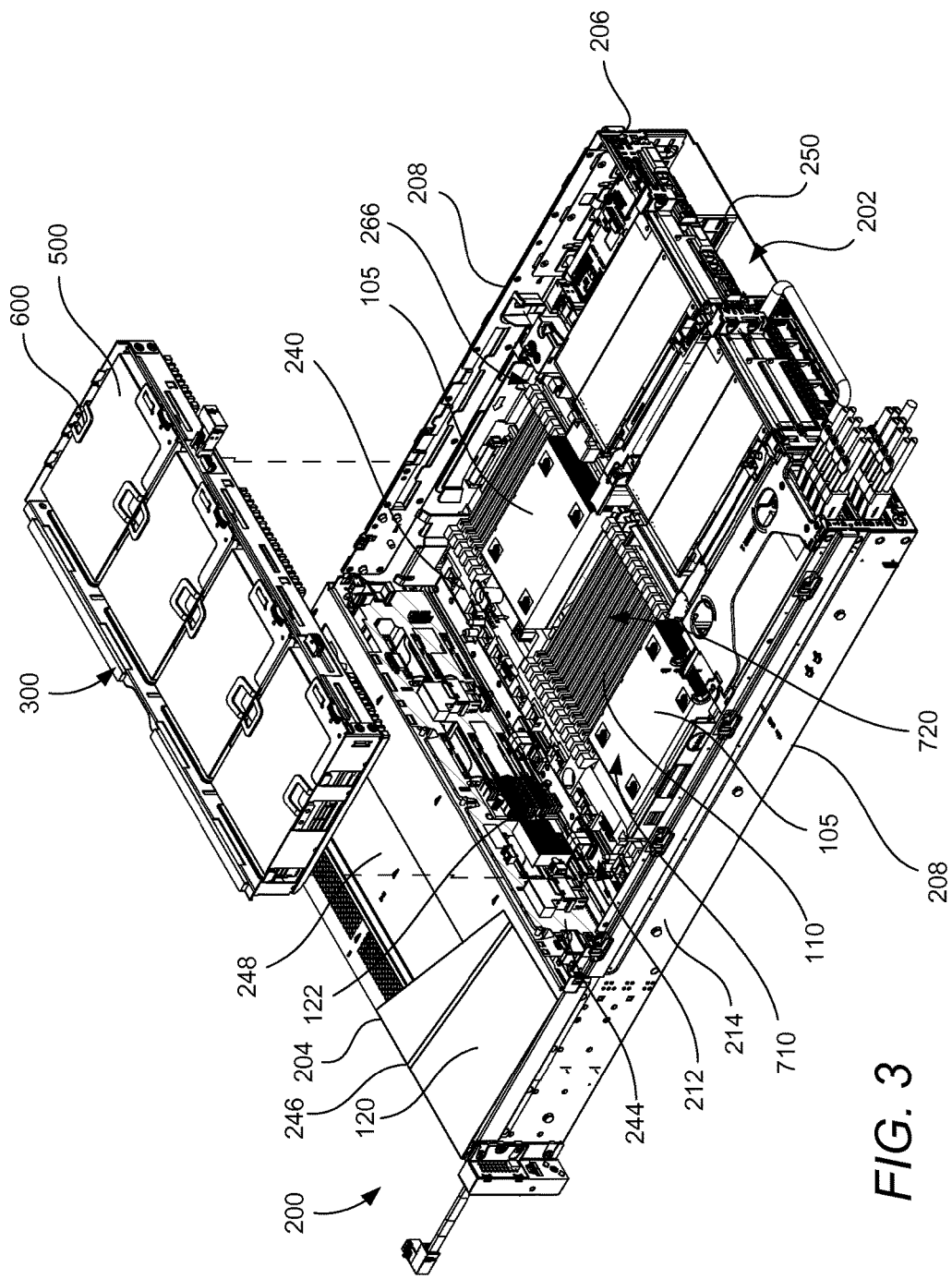
FIG. 3 illustrates a perspective view of an example server chassis with the supplemental storage tray removed and the cooling fans omitted, in accordance with one or more embodiments.

With reference now to FIG. 2 and FIG. 3, there are respectively illustrated one embodiment of a server chassis 200 with a supplemental storage tray 300 that can be utilized to mount one or more supplemental storage devices 500 to provide additional storage capacity to IHS 100. In the discussion of the following figures, reference is also made to elements described in the preceding figures. The physical electronic components that make up IHS 100 (FIG. 1) are mounted to and contained within chassis 200. Several of the server chassis 200 can be mounted to a rack (not shown). Chassis 200 includes a bottom wall 202, a front wall 204, a rear wall 206 and a pair of side walls 208. Front wall 204, rear wall 206 and side walls 208 are connected to bottom wall 202 and are vertically oriented generally perpendicular to bottom wall 202. The bottom wall 202, front wall 204, rear wall 206 and side walls 208 together define an interior cavity 212.

Figure 4:
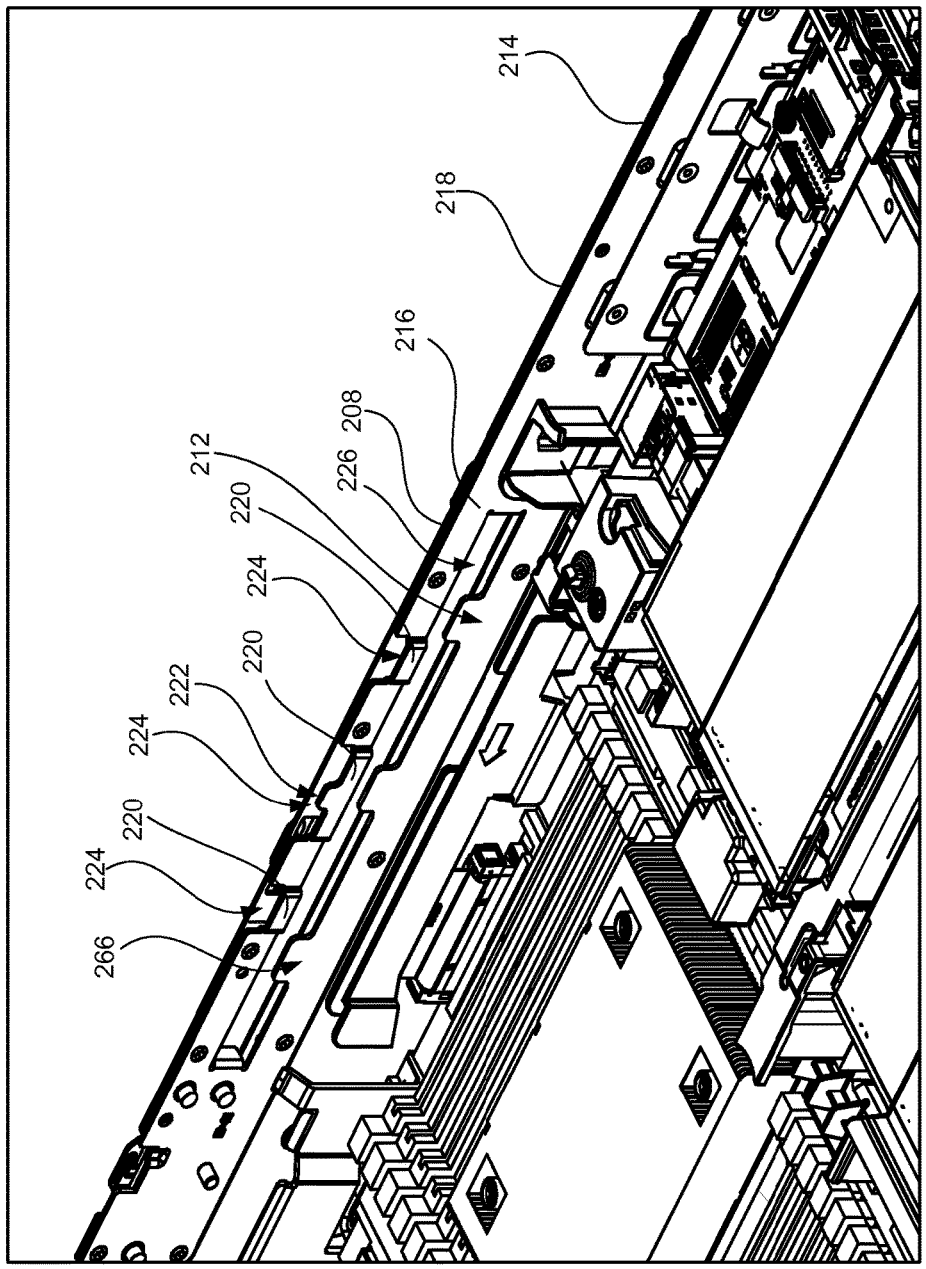
FIG. 4 illustrates an enlarged perspective view of a chassis side wall, in accordance with one or more embodiments.

With specific reference to FIG. 4, each of the side walls 208 of chassis 200 have an outer surface 214, an inner surface 216 and an upper edge or rim 218. Three shoulders 220 are formed on the inner surface 216 of each of the side walls 208 and are slightly spaced apart from each other in a center portion of the side walls 208. Shoulders 220 extend inwardly partially into interior cavity 212. A tab 222 extends upwardly from the center shoulder 220. Three slots 224 are defined between each of the shoulders 220 and the inner surface 216. A cable channel 226 is defined in each of the side walls 208.

Returning to FIGS. 2 and 3, a backplane 240 is affixed to bottom wall 202. Backplane 240 contains connectors, sockets and printed circuit lines (not shown) that form the electrical connections between the various electronic components of IHS 100. Backplane 240 carries power, ground and data signals. One or more processors 105 and one more memory devices 110 are mounted to backplane 240. In one embodiment, memory devices 110 are dual in line memory modules (DIMM) or single in line memory modules (SIMM). A printed circuit board 244 of the primary storage system is affixed to chassis 200, extending between side walls 208, and is generally perpendicular to backplane 240. The printed circuit board 244 of the primary storage system is electrically connected to backplane 240. Storage controller 122 is mounted to printed circuit board 244 such that the storage controller 122 is communicatively coupled to processor(s) 105 and memory 110.

Several primary storage devices 120 are mounted within a storage device cavity 246. The storage device cavity 246 is defined by front wall 204, printed circuit board 244 of primary storage system and side walls 208. Primary storage devices 120 extend between front wall 204 and primary storage system printed circuit board 244. The primary storage devices 120 are electrically connected to the primary storage system printed circuit board 244 by connectors (not shown) such that the primary storage devices 120 are communicatively coupled to storage controller 122. In one embodiment, primary storage devices 120 can be conventional hard disk drives that contain magnetic media arranged on rotating platters that are accessed by a moveable read/write head. In another embodiment, primary storage devices 120 can be solid state storage drives that contain non-volatile or flash memory devices. A lid 248 is mounted over storage device cavity 246 and the primary storage devices 120. In FIG. 3, a portion of lid 248 has been removed to illustrate the relative position of the primary storage devices 120.

One or more printed circuit boards 250 can be mounted in interior cavity 212 toward rear wall 206. The printed circuit boards 250 are electrically connected to backplane 240. Printed circuit boards 250 can contain various functional components of IHS 100 including I/O controllers 130 and network interface device (NID) 140. Several airflow movement or cooling devices 260 are mounted in interior cavity 212 between the primary storage system printed circuit board 244 and the processors 105 and memory devices 110. The airflow movement devices 260 rest on bottom wall 202 and extend between the side walls 208. The airflow movement devices 260 draw air through interior cavity 212 in order to cool primary storage devices 120, processors 105, memory devices 110 and other electronic components within chassis 200. In one embodiment, airflow movement devices 260 comprise six fans in a side by side arrangement. More or fewer airflow movement devices 260 can be used in chassis 200. The space above processors 105 and memory devices 110 and between airflow movement devices 260 and printed circuit boards 250 define a recess 266.

Figure 5:
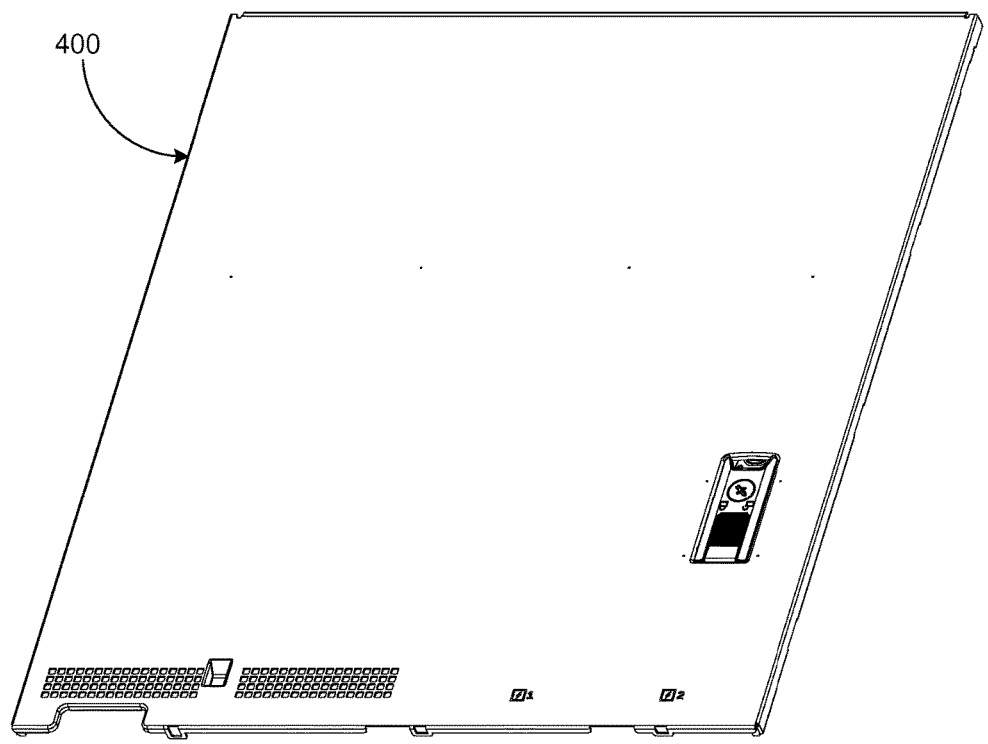
FIG. 5 illustrates a perspective view of a cover that encloses the chassis, in accordance with one or more embodiments.

Referring to FIG. 5, there is illustrated one embodiment of a cover 400 that is mounted over chassis 200. Cover 400 is supported by front wall 204, rear wall 206 and side walls 208 and encloses interior cavity 212. Cover 400 is affixed to chassis 200 by fasteners (not shown). Cover 400 protects the components of IHS 100 contained within chassis 200.

Figure 6:
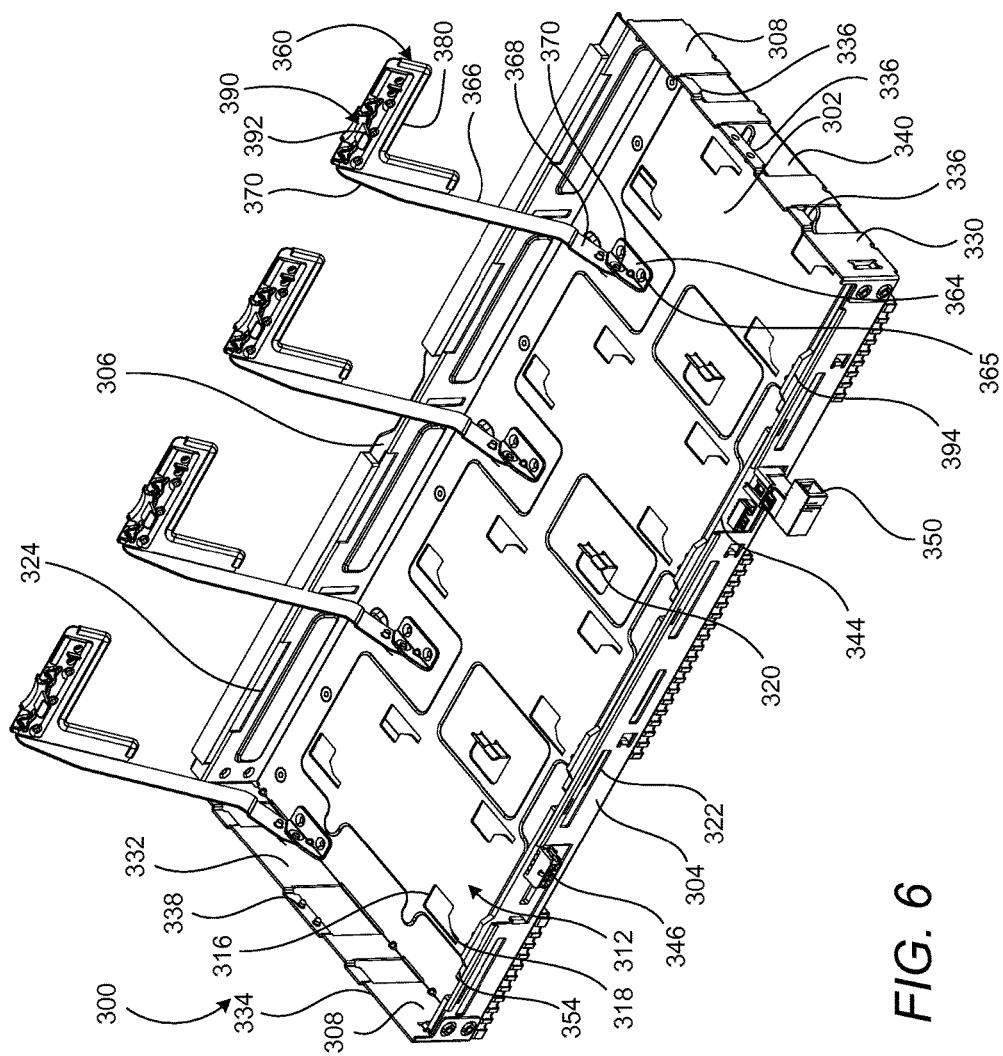
FIG. 6 illustrates a perspective view of the supplemental storage tray, in accordance with one or more embodiments.
Figure 7:
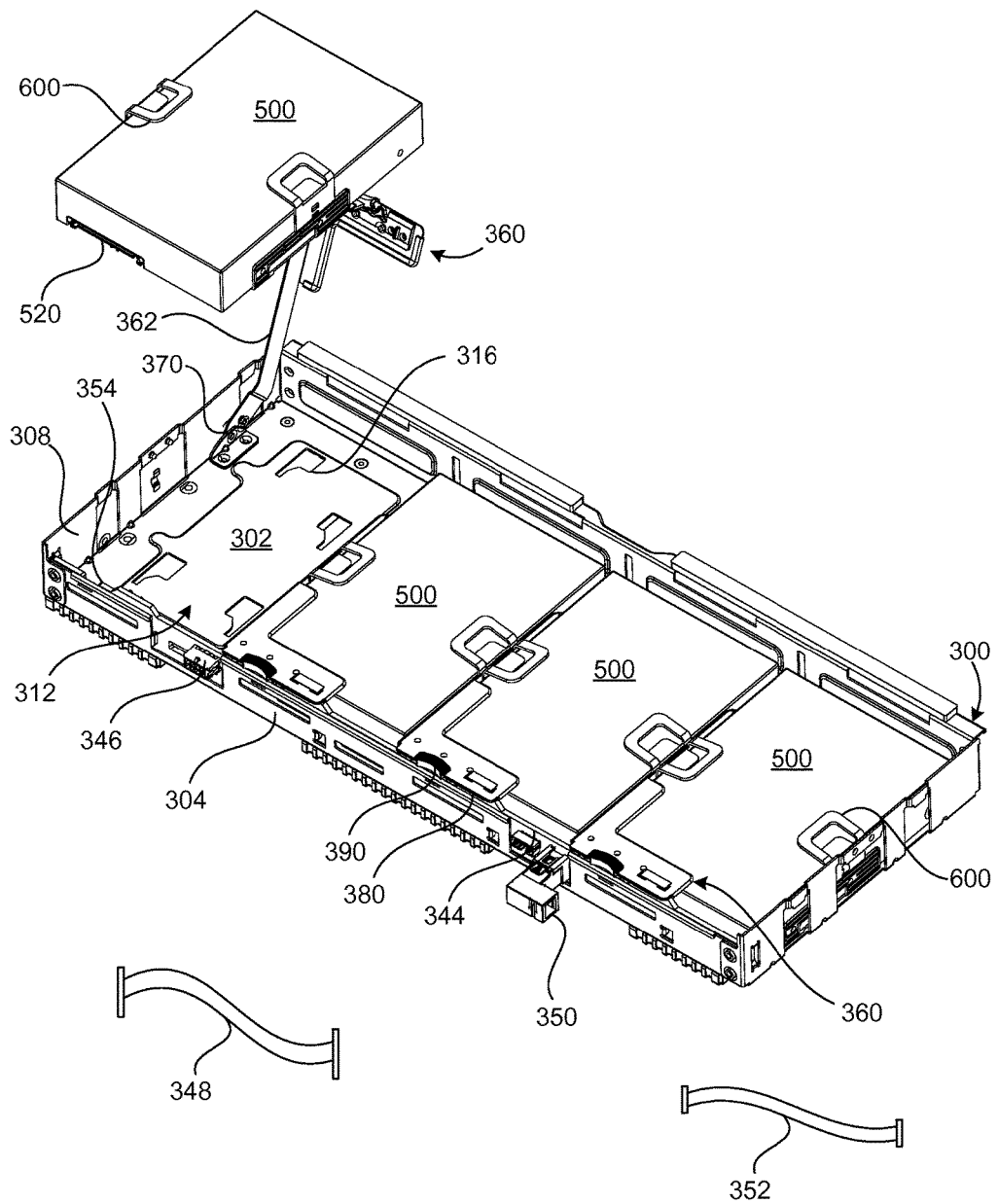
FIG. 7 illustrates a perspective view of the supplemental storage tray and a supplemental storage device, in accordance with one or more embodiments.

FIGS. 6 and 7 illustrate details of supplemental storage tray 300 that contains one or more supplemental storage devices 500. Example supplemental storage tray 300 is generally rectangular in shape, although other shapes can be provided in alternate embodiments. Supplemental storage tray 300 includes a bottom plate 302, a front plate 304, a rear plate 306 and a pair of side plates 308. Front plate 304, rear plate 306 and side plates 308 are connected to bottom plate 302 and are vertically oriented in a generally perpendicular orientation to bottom plate 302. The plates can be connected using suitable methods such as by welding or by the use of fasteners. Supplemental storage tray 300 can be formed from suitable materials such as metal or plastic. In one embodiment, supplemental storage tray 300 is formed by a unitary piece of metal. The bottom plate 302, front plate 304, rear plate 306 and side plates 308 together define one or more bays 312. In FIG. 6, four bays 312 are shown; however, it is appreciated that supplemental storage tray 300 can be formed with more or less than four bays 312. Supplemental storage devices 500 are mounted in bays 312.

Several retention features 316 are formed in the bottom plate 302 in each bay 312. The retention features 316 are in the form of an opening in bottom plate 302 with a groove 318 that extends partially towards front plate 304. In FIG. 6, four retention features 316 are shown in each bay 312. It is appreciated that supplemental storage tray 300 can be formed with more or less than four retention features 316 in each bay 312. Fins 320 are located on bottom plate 302 and extend upwardly from bottom plate 302 into a bay 312. Fins 320 are positioned on bottom plate 302 between each of the bays 312. Four cooling passages 322 are defined in front plate 304 and four cooling passages 324 are defined in rear plate 306.

Each of the side plates 308 have an outer surface 330, an inner surface 332 and an upper edge or rim 334. Three rails 336 are formed on each of the side plates 308 and are slightly spaced apart from each other in a center portion of the side plates 308. The rails 336 are located adjacent to rim 334 and extend outwardly from outer surface 330. Two posts 338 extend inward from each of the center rails 336 towards bay 312. The posts 338 are perpendicular to the center rails 336. Three openings 340 are defined in each of the side plates 308 below rails 336.

A supplemental storage device printed circuit board 344 is affixed to the inner surface of the front plate 304. The supplemental storage device printed circuit board 344 extends along the length of supplemental storage tray 300 between the side plates 308. A power connector 346 is affixed to supplemental storage device printed circuit board 344 and faces away from front wall 304. A power cable 348 (FIG. 7) has one end connected to power connector 346 and another end connected to backplane 240. The power cable 348 provides electrical power to supplemental storage device printed circuit board 344 from backplane 240. A data connector 350 is connected to supplemental storage device printed circuit board 344 and faces away from front wall 304. A data cable 352 (FIG. 7) has one end connected to data connector 350 and another end connected to the primary storage system printed circuit board 244. The data cable 352 provides an electrical connection between the supplemental storage device printed circuit board 344 and the primary storage system printed circuit board 244 such that the storage controller 122 is communicatively coupled to the supplemental storage devices 500. The data cable 352 is routed through the cable channel 226 (FIG. 4). Four storage device connectors 354 are connected to supplemental storage device printed circuit board 344 and face toward bay 312.

Supplemental storage tray 300 further includes a retention mechanism 360. Retention mechanism 360 is affixed to bottom plate 302. Retention mechanism 360 comprises a bracket 362, a handle 380 and a lock 390. The lock 390 is attached to the handle 380 and the handle 380 is attached to the bracket 362. Bracket 362 includes a base 364 and an elongated arm 366. Base 364 is affixed to bottom plate 302 by fasteners 365. Arm 366 has an angled proximal end 368 that is proximal to base 364 and is pivotally connected to base 364 by a pin 370. Arm 366 also has a distal end 372 that is distal to base 364. Arm 366 can rotate about pin 370 between open and closed positions. The handle 380 is attached to distal end 372 and extends perpendicularly away from distal end 372. The lock 390 is attached to the handle 380. The lock 390 has a spring loaded latch 392 that engages a tab 394 on the inner side of front plate 304 when the handle 380 is rotated to a closed position.

Figure 8:
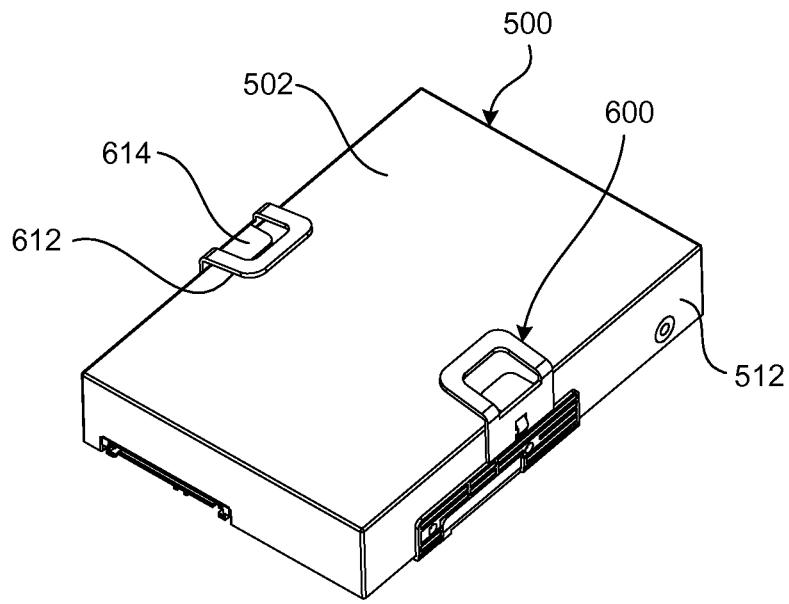
FIG. 8 illustrates a top perspective view of the supplemental storage device and carrier, in accordance with one or more embodiments.
Figure 9:
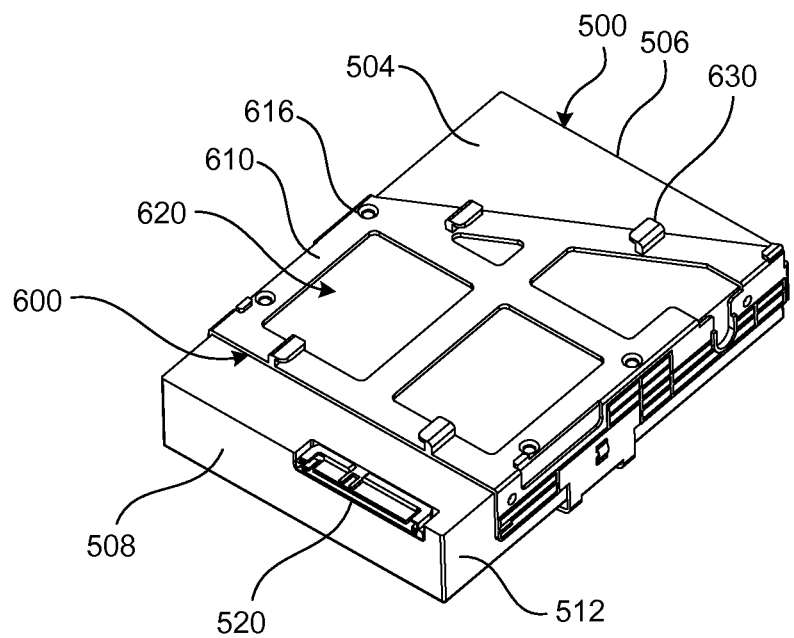
FIG. 9 illustrates a bottom perspective view of the supplemental storage device and carrier, in accordance with one or more embodiments.

FIGS. 8 and 9 illustrate details of supplemental storage device 500 and supplemental storage device carrier 600. Supplemental storage device 500 has a top side 502, a bottom side 504, a front side 506, a back side 508 and side surfaces 510. Example supplemental storage device 500 is generally rectangular in shape. A connector 520 is attached to back side 508. Connector 520 mates with another connector (not shown) on supplemental storage device printed circuit board 344 (FIG. 6). In one embodiment, supplemental storage devices 500 can be conventional hard disk drives that contain magnetic media arranged on rotating platters that are accessed by a moveable read/write head. In another embodiment, supplemental storage devices 500 can be solid state storage drives that contain non-volatile or flash memory devices.

The supplemental storage device 500 is attached or coupled to supplemental storage device carrier 600. Supplemental storage device carrier 600 partially surrounds supplemental storage device 500. The supplemental storage device carrier 600 has a frame 610. A pair of C-shaped arms 612 extends from opposite sides of frame 610. A spring clip 614 is formed in each of arms 612. Bottom frame 610 and arms 612 define a receptacle 620 that receives the supplemental storage device 500. Supplemental storage device 500 is slid into receptacle 620 such that frame 610 is adjacent to bottom side 504 and C-shaped arms 612 surround side surfaces 510 and extend over top side 502. The spring clips 614 are pressed against top side 502. Fasteners 616 affix supplemental storage device carrier 600 to supplemental storage device 500. Four L-shaped hooks 630 extend perpendicularly away from the bottom surface of frame 610. Two of the L-shaped hooks 630 are positioned on frame 610 towards supplemental storage device front side 506 and two are positioned toward supplemental storage device back side 508.

Turning to FIG. 7, the combination of the supplemental storage device carrier 600 and the attached supplemental storage device 500 are inserted into supplemental storage tray 300. Initially, the bracket 362 of retention mechanism 360 is in an open position as shown by the left most retention mechanism 360 in FIG. 7. Bracket 362 and handle 380 are rotated clockwise away from supplemental storage tray 300.

The supplemental storage device carrier 600 with supplemental storage device 500 included therein is inserted into one of the bays 312 such that frame 610 is adjacent to bottom plate 302 and the L-shaped hooks 630 extend through retention feature openings 316. The supplemental storage device carrier 600 is moved within bay 312 towards front plate 304 such that the L-shaped hooks 630 slide into bottom plate grooves 318. The L-shaped hooks 630 and the bottom plate 302 are dimensioned such that an interference fit is created between the hook portion of L-shaped hooks 630 and bottom plate 302. In this position, the supplemental storage device carrier 600 is mounted to supplemental storage tray 300 by L-shaped hooks 630 and retention feature 316. Also, in this position, the storage device connector 520 is mated and engaged with the storage device connector 354 of printed circuit board 344.

The handle 380 and bracket 362 are rotated counterclockwise about pin 370 until the handle 380 abuts and extends slightly over front wall 304. In this position, the spring loaded latch 392 of lock 390 is engaged with the tab 394 on the inner side of front plate 304 such that the retention mechanism 360 is in a closed position and is also in a locked state, as shown by the right most retention mechanism 360. The retention mechanism 360 holds the supplemental storage device carrier 600 and storage device 500 to supplemental storage tray 300.

The supplemental storage device carrier 600 and storage device 500 can also be selectively removed from the supplemental storage tray 300. A user can depress the spring loaded latch 392 of lock 390 causing the disengagement of tab 394 from latch 392. The bracket 362 and handle 380 are rotated clockwise away from supplemental storage tray 300 to an open position, as shown by the left most retention mechanism 360 in FIG. 7. The supplemental storage device carrier 600 is moved within bay 312 away from front plate 304 such that the L-shaped hooks 630 disengage from bottom plate grooves 318. The supplemental storage device carrier 600 and storage device 500 can then be removed from supplemental storage tray 300.

With reference to FIGS. 2, 3 and 6, the supplemental storage tray 300 containing supplemental storage devices 500 is mounted into a non-essential area 710 within the interior cavity 212. The supplemental storage tray 300 is positioned about a central area of chassis 200. In particular, the supplemental storage tray 300 is suspended from side walls 208 and is located above processors 105 and memory devices 110. Specifically, the supplemental storage tray rails 336 extend over and rest on the chassis wall shoulders 220. The bottom most portion of the rails 336 are tapered and are received in shoulder slots 224. The tab 222 of the center shoulder 220 extends upwardly toward the center rail 336 such that tab 222 is captured between posts 338. The tapered rails 336 and shoulders 220 are dimensioned such that when the supplemental storage tray 300 is lowered into the non-essential area 710, the tapered rails 336 guide the supplemental storage tray 300 into the proper position. The tab 222 is also tapered, and as the supplemental storage tray 300 is lowered, posts 338 and tab 222 center the supplemental storage tray 300 above processors 105 and memory devices 110. With the supplemental storage tray 300 mounted in chassis 200, a gap 720 is formed between the bottom surface of the bottom plate 302 and the top of the processors 105 and memory devices 110.

The chassis 200 has walls 202, 204, 206 and 208 that define an interior cavity 212 within the chassis. A backplane 240 is mounted to a bottom wall 202 of the chassis and one or more processors 105 are connected to the backplane 240. A first storage device 120 is connected to the chassis and is communicatively coupled to the processor(s). A supplemental storage tray 300 has perimeter plates 302, 304, 306 and 308 that define a bay 312 within the supplemental storage tray. The supplemental storage tray 300 is suspended above the processor(s) 105 by at least one wall 208 of the chassis. A supplemental storage device 500 is disposed in the bay 312 and is communicatively coupled to the processor(s). The supplemental storage device 500 provides additional storage capacity to the information handling system 100.

The airflow movement devices 260 draw cooling air from the chassis front side 204 over the primary storage devices 120 and through airflow movement devices 260. The airflow through chassis 200 is then split into an upper airflow path 730 and a lower airflow path 740. The upper airflow path 730 flows through cooling passages 324 over supplemental storage devices 500 and out of cooling passages 322. The air flow continues over printed circuit boards 250 and exits chassis 200 at the rear side 206. The lower airflow path 740 flows through gap 720 and over and around processors 105 and memory devices 110. The air flow continues over printed circuit boards 250 and exits chassis 200 at the rear side 206. The supplemental storage tray 300 at least partially directs some of the air generated by the air flow movement devices 260 to flow through the gap 720.

The supplemental storage tray 300 is mounted into a non-essential area 710 within interior cavity 212 above processors 105 within the information handling system chassis 200, such that the supplemental storage tray 300 is suspended above the processors 105 and other functional components affixed to the backplane 240. The supplemental storage tray 300 has perimeter plates 302, 304, 306 and 308 defining a bay 312. At least one supplemental storage device 500 is secured in the bay 312. The at least one supplemental storage device 500 is communicatively coupled with the processors 105 to provide additional storage capacity within the electronic enclosure 200 beyond a storage capacity of the at least one first storage device 120.

Figure 10:
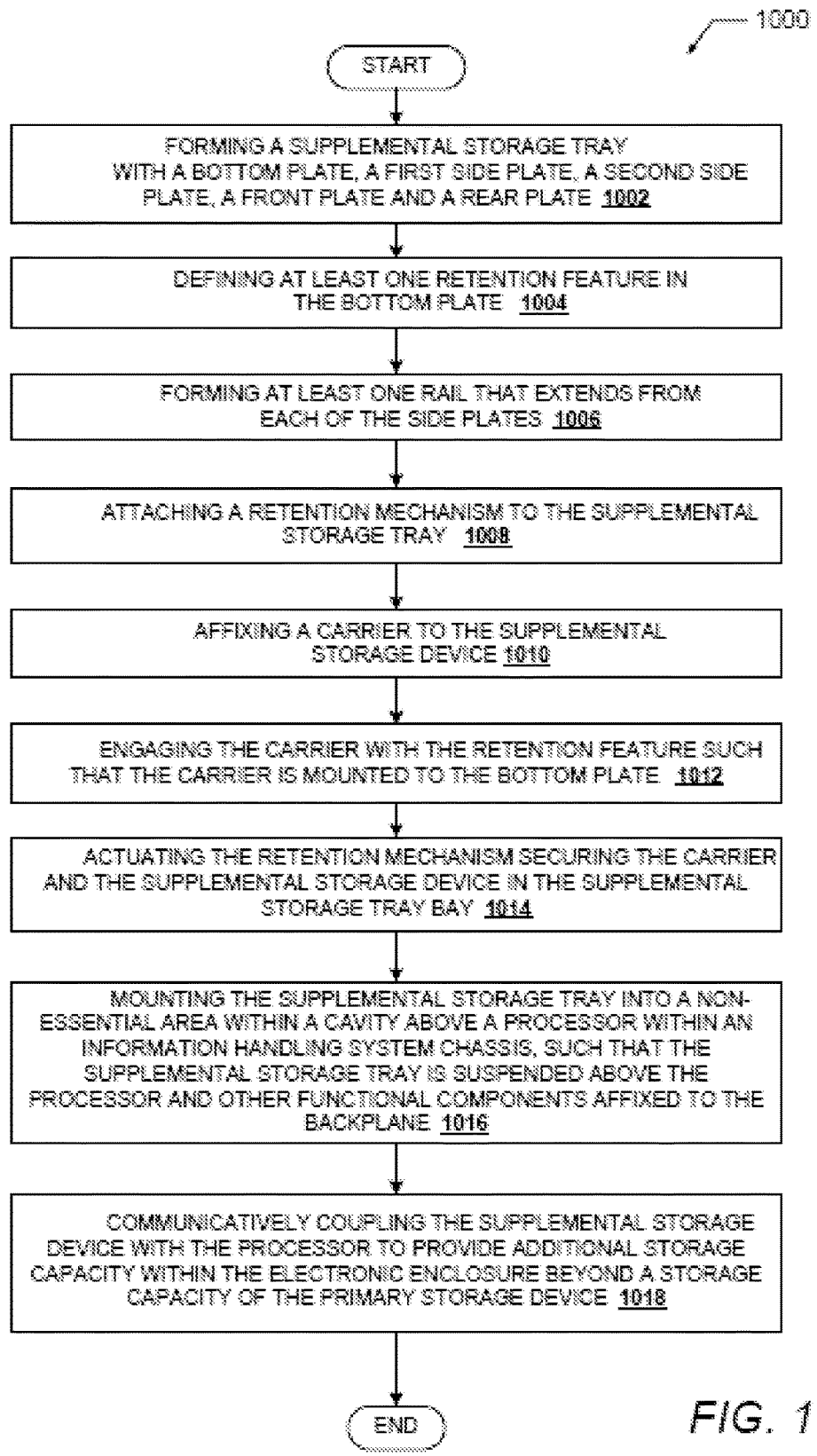
FIG. 10 is a flow chart illustrating one example of a method for increasing storage within an electronic enclosure, according to one or more embodiments.

FIG. 10 illustrates a flowchart of an exemplary method for increasing storage within an electronic enclosure chassis. Generally, method 1000 represents a method to increase storage capacity within an information handling system. In the discussion of FIG. 10, reference is also made to components illustrated in FIGS. 1-9. Method 1000 begins at the start block and proceeds to block 1002 where the supplemental storage tray 300 is formed with a bottom plate 302, a first side plate 308, a second side plate 308, a front plate 304 and a rear plate 306. At least one retention feature 316 is defined in the bottom plate (block 1004). At block 1006, at least one rail 336 is formed that extends from each of the side plates. A retention mechanism 360 is attached to the supplemental storage tray (block 1008). The retention mechanism is configured to selectively hold and release the supplemental storage device 500. A carrier 600 is affixed to the supplemental storage device 500 (block 1010). The carrier is engaged with the retention feature such that the carrier is held to the bottom plate (block 1012). At block 1014, the retention mechanism 360 is actuated to secure the carrier and the supplemental storage device in the supplemental storage tray bay 312.

At block 1016, the supplemental storage tray 300 is mounted into a non-essential area 710 within a cavity 212 above a processor 105 within an information handling system chassis 200, such that the supplemental storage tray is suspended above the processor and other functional components affixed to the backplane 240. The at least one supplemental storage device 500 is communicatively coupled with the processor 105 to provide additional storage capacity within the electronic enclosure beyond a storage capacity of the primary storage device 120 (block 1018). Method 1000 then ends.

The supplemental storage tray 300 and supplemental storage devices 500 advantageously replace a non-essential shroud mounted above the processor and memory devices providing additional storage capacity within the electronic enclosure 200. The supplemental storage devices 500 increase the storage capacity of IHS 100 to be greater than the storage capacity provided by the primary storage system devices 120 alone.

In the above described flow chart, one or more of the methods may be embodied in a computer readable medium containing computer readable code such that a series of functional processes are performed when the computer readable code is executed on a computing device. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object oriented programming language, without limitation. These computer program instructions may be provided to a processor of a general purpose computer, special purpose computer, such as a service processor, or other programmable data processing apparatus to produce a machine, such that the instructions, which execute via the processor of the computer or other programmable data processing apparatus, performs the method for implementing the functions/acts specified in the flowchart and/or block diagram block or blocks.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

As will be further appreciated, the processes in embodiments of the present disclosure may be implemented using any combination of software, firmware or hardware. Accordingly, aspects of the present disclosure may take the form of an entirely hardware embodiment or an embodiment combining software (including firmware, resident software, micro-code, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. An information handling system comprising:
a chassis having walls defining an interior cavity within the chassis and a bottom wall defining a backplane on which one or more processors are physically connected;
at least one first storage device connected to the chassis and communicatively coupled to the processor from another location within the chassis;
a supplemental storage tray having perimeter plates defining at least one bay within the supplemental storage tray for receiving a supplemental storage device that is communicatively coupled to the processor and provides additional storage capacity to the information handling system, the supplemental storage tray being physically located above the processor and in a different location from the first storage device, each of the at least one bay having a plurality of retention features formed therein in the form of an opening in a bottom plate with a groove that extends partially towards a front plate for receiving an L-shaped hook that extends from a bottom surface of a storage device carrier frame.

2. The information handling system of claim 1, wherein the chassis further comprises:
a first side wall and a second side wall connected to the bottom wall, the bottom wall, the first side wall and the second side wall defining the interior cavity; and
a cover mounted to the first and second side walls.

3. The information handling system of claim 1, wherein the supplemental storage tray further comprises:
a first side plate and a second side plate connected to a bottom plate; a front plate and a rear plate connected to the bottom plate;
the bottom plate, the first side plate, the second side plate, the front plate and the rear plate defining the bay.

4. The information handling system of claim 1, wherein the supplemental storage tray further comprises:
at least one rail extending from at least one side plate, the rail extending over a wall of the chassis such that the supplemental storage tray is suspended from the wall.

5. The information handling system of claim 1, wherein the supplemental storage tray further comprises:
at least one retention mechanism connected to the supplemental storage tray, the retention mechanism configured to selectively hold and release the supplemental storage device, wherein the at least one retention mechanism is affixed to the bottom plate and comprises a bracket, a handle, and a lock having a spring-loaded latch that engages a tab latch on an inner side of the front plate when the handle is rotated to a closed position.

6. The information handling system of claim 5, further comprising:
the supplemental storage device, wherein the supplemental storage device comprises a carrier affixed to the supplemental storage device, the carrier engaged with the retention mechanism such that the carrier is retained to the bottom plate.

7. The information handling system of claim 5, wherein the retention mechanism further comprises:
a bracket affixed to the supplemental storage tray;
a handle connected to the bracket; and
a lock mounted to the handle, the lock retaining the handle in a closed position.

8. The information handling system of claim 1, wherein the supplemental storage tray further comprises:
a printed circuit board connected to a rear plate of the supplemental storage tray;
at least one connector affixed to the printed circuit board; and
a cable connected between the printed circuit board and the backplane.

9. The information handling system of claim 1, further comprising:
at least one airflow movement device coupled to the chassis for moving air across the processor and the at least one first storage device.

10. The information handling system of claim 9, wherein a gap is formed between a bottom surface of the supplemental storage tray and a top of the one or more processors, wherein air generated by the air flow movement device is directed to flow through the gap.

11. A supplemental storage tray for use with an information handling system, the information handling system having at least one first storage device connected to a chassis and communicatively coupled to a processor, the supplemental storage tray comprising:
a plurality of perimeter plates defining at least one bay within the supplemental storage tray, the supplemental storage tray connected to a chassis of the information handling system in a position that is located physically above the processor and separate from the at least one first storage device, the supplemental storage tray configured to receive a supplemental storage device that provides additional storage capacity to the information handling system, each of the at least one bay having a plurality of retention features formed therein in the form of an opening in a bottom plate with a groove that extends partially towards a front plate for receiving an L-shaped hook that extends from a bottom surface of a storage device carrier frame.

12. The supplemental storage tray of claim 11, further comprising:
a first and a second side plate connected to a bottom plate;
a front plate and a rear plate connected to the bottom plate;
the bottom plate, the first side plate, the second side plate, the front plate and the rear plate defining the bay; and
at least one retention feature formed in the bottom plate.

13. The supplemental storage tray of claim 11, further comprising:
at least one rail extending from at least one side plate of the supplemental storage tray, the rail extending over the chassis such that the supplemental storage tray is suspended from the chassis.

14. The supplemental storage tray of claim 11, further comprising:
a retention mechanism connected to the supplemental storage tray, the retention mechanism configured to selectively hold and release the supplemental storage device, wherein the retention mechanism further comprises:
a bracket affixed to the supplemental storage tray;
a handle connected to the bracket; and
a lock mounted to the handle, the lock retaining the handle in a closed position.

15. The supplemental storage tray of claim 14, wherein the supplemental storage device further comprises:
a carrier affixed to the supplemental storage device, the carrier engaged with the retention mechanism such that the carrier is retained to the bottom plate.

16. The supplemental storage tray of claim 10, wherein the chassis further comprises:

at least one airflow movement device coupled to the chassis for moving air across the processor and the at least one first storage device; and a gap formed between a bottom surface of the supplemental storage tray and a top of the processor, wherein air generated by the air flow movement device is directed to flow through the gap.

17. A method for increasing storage within an electronic enclosure having at least one first storage device, the method comprising:

mounting a supplemental storage tray into a non-essential area within a cavity above a processor within an information handling system chassis, such that the supplemental storage tray is suspended above the processor and other functional components affixed to a backplane, the supplemental storage tray having perimeter plates defining at least one bay, each of the at least one bay having a plurality of retention features formed therein in the form of an opening in a bottom plate with a groove that extends partially towards a front plate for receiving an L-shaped hook that extends from a bottom surface of a storage device carrier frame; and securing at least one supplemental storage device in the bay using a retention mechanism attached to the supplemental storage tray, the supplemental storage device being a different storage device from the at least one first storage device and physically located in a different location of the information handling system chassis; and communicatively coupling the at least one supplemental storage device with the processor to provide additional storage capacity within the electronic enclosure beyond a storage capacity of the at least one first storage device.

18. The method of claim 17, further comprising:

forming the supplemental storage tray with a bottom plate, a first side plate, a second side plate, a front plate and a rear plate; and attaching the retention mechanism to the supplemental storage tray, the retention mechanism configured to selectively hold and release the supplemental storage device via a carrier affixed to the supplemental storage device that engages with the retention feature.

19. The method of claim 18, further comprising:

forming at least one rail that extends from at least one side plate;

positioning the rails relative to the chassis such that the supplemental storage tray is suspended from the chassis.

20. The method of claim 18, further comprising:

affixing a bracket to the supplemental storage tray;

connecting a handle to the bracket; and mounting a lock to the handle, the lock retaining the handle in a closed position.

* * * * *